(12) United States Patent
Yang et al.

(10) Patent No.: US 12,727,485 B2
(45) Date of Patent: Sep. 1, 2026

(54) METHOD FOR FORMING ALIGNMENT KEYS OF SEMICONDUCTOR STRUCTURE AND SEMICONDUCTOR STRUCTURE HAVING ALIGNMENT KEYS

(71) Applicant: United Microelectronics Corporation, Hsinchu (TW)

(72) Inventors: Tsung-Yu Yang, Chiayi County (TW); Shin-Hung Li, Nantou County (TW); Shan-shi Huang, Hsinchu City (TW); Ruei Jhe Tsao, New Taipei City (TW); Che-Hua Chang, New Taipei City (TW); Yuan Yu Chung, Tainan City (TW)

(73) Assignee: United Microelectronics Corporation, Hsinchu (TW)

( * ) Notice: Subject to any disclaimer, the term of this patent is extended or adjusted under 35 U.S.C. 154(b) by 681 days.

(21) Appl. No.: 17/953,263

(22) Filed: Sep. 26, 2022

(65) Prior Publication Data

US 2024/0055361 A1 Feb. 15, 2024

(30) Foreign Application Priority Data

Aug. 12, 2022 (TW) .................................. 111130404

(51) Int. Cl.

| | |
|---|---|
| ***H01L 23/544*** | (2006.01) |
| ***H10D 84/01*** | (2026.01) |
| ***H10P 30/22*** | (2026.01) |
| ***H10P 50/00*** | (2026.01) |
| ***H10W 46/00*** | (2026.01) |

(52) U.S. Cl.
CPC ........ *H10W 46/00* (2026.01); *H10D 84/0156* (2025.01); *H10D 84/0191* (2025.01); *H10P 30/22* (2026.01); *H10P 50/73* (2026.01); *H10W 46/301* (2026.01)

(58) Field of Classification Search
CPC ....... H01L 23/544; H01L 2223/54426; H10W 46/00; H10W 46/301; H10P 30/22; H10D 84/0156; H10D 84/0191
See application file for complete search history.

(56) References Cited

U.S. PATENT DOCUMENTS

| | | | | |
|---|---|---|---|---|
| 2003/0127671 A1* | 7/2003 | Kim | ...................... | H10W 46/00 257/E23.179 |
| 2007/0037359 A1 | 2/2007 | Jo | | |
| 2020/0388527 A1* | 12/2020 | Dong | ................ | H01L 21/76224 |

* cited by examiner

*Primary Examiner* — Jose R Diaz

(57) ABSTRACT

A method for forming alignment keys of a semiconductor structure includes: forming an oxide pad layer and a passivation layer on a substrate; forming a patterned photoresist layer on the passivation layer, and using the patterned photoresist layer as a mask to remove part of the oxide pad layer and passivation layer and expose the substrate surface in the medium voltage and alignment mark regions; forming oxide portions on the exposed substrate surface, and the oxide portions extending into the first depth of the substrate; forming deep doped wells in the low voltage and medium voltage regions; thinning the oxide portions; forming high-voltage doped wells in the high voltage and alignment mark regions; performing an etching process on the high voltage and alignment mark regions to form a second trench, as an alignment key, having a second depth greater than the first depth in the alignment mark region.

5 Claims, 8 Drawing Sheets

METHOD FOR FORMING ALIGNMENT KEYS OF SEMICONDUCTOR STRUCTURE AND SEMICONDUCTOR STRUCTURE HAVING ALIGNMENT KEYS

FIELD OF THE INVENTION

The present invention relates to a semiconductor technology, and more particularly to a method for forming alignment keys of a semiconductor structure and a semiconductor structure having alignment keys.

BACKGROUND OF THE INVENTION

In the manufacturing process of integrated circuits (ICs), the lithography technology is used to transfer the mask pattern of the designed circuit layout to the semiconductor wafer. There are many different layers in the circuit layout. Thus, in order to expose the pattern in each layer correctly in the designed area, the circuit pattern of different layers must be aligned by an alignment mark during the exposure, so as to connect the circuit designed in different layers.

The original alignment marks are formed on the semiconductor substrate by using a zero mask. Typically, the alignment marks are a pattern recessed into the substrate surface, the pattern has a step height with respect to the substrate surface. A plurality layers of film cover the substrate surface during the manufacturing process, including covering the original alignment marks.

However, when the subsequent film layer covering the original alignment marks is a thicker light absorbing layer, the concave depth of the alignment marks will not be enough to provide the alignment function during exposure, which will affect the wafer quality (WQ). In addition, the use of the zero mask may lead to higher production costs.

SUMMARY OF THE INVENTION

The present invention provides a method for forming alignment keys of a semiconductor structure and a semiconductor structure having alignment keys, which have the advantages of saving the cost of the mask and improving the wafer quality.

The method for forming alignment keys of a semiconductor structure provided by the present invention includes steps of: providing a substrate, wherein at a low voltage region, a medium voltage region, a high voltage region and an alignment mark region are defined on the substrate, and the high voltage region is adjacent to the alignment mark region; forming an oxide pad layer on the substrate; forming a passivation layer on the oxide pad layer; forming a first patterned photoresist layer on the passivation layer, wherein the first patterned photoresist layer has a first patterned opening, the first patterned opening corresponds to and expose the medium voltage region and the alignment mark region; using the first patterned photoresist layer as a mask to remove a part of the passivation layer and a part of the oxide pad layer exposed through the first patterned opening, so as to form a groove on the stacked oxide pad layer and passivation layer, wherein the groove corresponds to the medium voltage region and the alignment mark region, and a part of the substrate is exposed through the groove; removing the first patterned photoresist layer; performing an oxidation process on the exposed part of the substrate in the groove to form an oxide portion on a part of the substrate, wherein the oxide portion corresponds to the medium voltage region and the alignment mark region, and the oxide portion is formed in the groove and extends into a first depth of the substrate; forming a second patterned photoresist layer, wherein the second patterned photoresist layer has a second patterned opening, the second patterned opening corresponds to the low voltage region and the medium voltage region, the second patterned photoresist layer covers the oxide portion in the alignment mark region and a part of the passivation layer in the high voltage region and exposes the oxide portion in the medium voltage region and a part of the passivation layer in the low voltage region; using the second patterned photoresist layer as a mask to perform a first ion implantation on the medium voltage region and the low voltage region through the second patterned opening; removing the second patterned photoresist layer; performing a cleaning process to remove a part of the oxide portion located in the groove; forming a third patterned photoresist layer, wherein the third patterned photoresist layer has a third patterned opening, the third patterned opening corresponds to the high voltage region and the alignment mark region, and the third patterned photoresist layer covers the oxide portion in the medium voltage region and a part of the passivation layer in the low voltage region and exposes the oxide portion in the alignment mark region and a part of the passivation layer in the high voltage region; using the third patterned photoresist layer as a mask to perform a second ion implantation on the high voltage region and the alignment mark region through the third patterned opening; using the third patterned photoresist layer as a mask to perform an etching process on the high voltage region and the alignment mark region, so as to remove the oxide portion and a part of the substrate in the alignment mark region and remove a part of the passivation layer in the high voltage region, wherein a second trench having a second depth is formed in the alignment mark region of the substrate; removing the third patterned photoresist layer; removing the passivation layer; and removing the oxide pad layer and the oxide portion, wherein a first trench having the first depth is formed in the medium voltage region after the oxide portion in the medium voltage region is removed, and the first depth is less than the second depth.

In an embodiment of the present invention, a part of the substrate located on sides of the oxide portion in the high voltage region is further laterally oxidized during the oxidation process.

In an embodiment of the present invention, a deep N-type well is formed through the first ion implantation, and a high-voltage P-type well is formed through the second ion implantation.

In an embodiment of the present invention, dilute hydrofluoric acid is used for cleaning to thin the oxide portion during the cleaning process.

In an embodiment of the present invention, a thickness of the oxide portion is between 400 and 500 angstroms.

In an embodiment of the present invention, a thickness of the oxide pad layer is between 80 and 140 angstroms.

In an embodiment of the present invention, a thickness of the passivation layer is between 200 and 500 angstroms.

In an embodiment of the present invention, a material of the oxide pad layer is silicon oxide.

In an embodiment of the present invention, a material of the passivation layer is silicon nitride or titanium nitride.

In an embodiment of the present invention, the passivation layer is removed with a phosphoric acid solution.

In an embodiment of the present invention, in the step of removing the oxide pad layer and the oxide portion, dilute hydrofluoric acid is used to remove the oxide pad layer and the oxide portion.

In an embodiment of the present invention, the second trench extends to a junction of the alignment mark region and the high voltage region, and the second trench has a sidewall.

In an embodiment of the present invention, after the step of removing the oxide pad layer and the oxide portion, a recessed surface is formed in the high voltage region of the substrate adjacent to the junction, the recessed surface is connected to the sidewall, an angle is formed between the recessed surface and the sidewall, and the angle is between 90 and 135 degrees.

The semiconductor structure having alignment keys provided by the present invention includes a substrate, a first trench, a second trench, a recessed surface, a deep doped well and a high-voltage doped well. A low voltage region, a medium voltage region, a high voltage region and an alignment mark region are defined on the substrate, and the high voltage region is adjacent to the alignment mark region. The first trench is formed in the medium voltage region of the substrate. The second trench is formed in the alignment mark region of the substrate and extends to a junction of the alignment mark region and the high voltage region. The second trench has a sidewall. The first trench has a first depth, the second trench has a second depth, and the second depth is greater than the first depth. The recessed surface is formed in the high voltage region of the substrate adjacent to the junction. The recessed surface is connected to the sidewall. An angle is formed between the recessed surface and the sidewall. The deep doped well is formed in the medium voltage region and the low voltage region. The high-voltage doped well is formed in the high voltage region and the alignment mark region, wherein a doping type of the deep doped well is different from a doping type of the high voltage doped well.

In an embodiment of the present invention, the recessed surface has a first slope, the sidewall has a second slope, and the first slope is smaller than the second slope.

In an embodiment of the present invention, the deep doped well is a deep N-type well, and the high-voltage doped well is a high-voltage P-type well.

In an embodiment of the present invention, the second depth is greater than 280 angstroms.

In an embodiment of the present invention, the first depth is less than 200 angstroms.

In the present invention, the first patterned photoresist layer defined by the TGR mask which is controlled by the step height in the medium voltage region is used as the first photoresist for forming the alignment keys. In addition to defining the pattern in the medium voltage region, the first patterned photoresist layer also defines the pattern in the alignment mark region. The first patterned photoresist layer forms a groove for exposing the medium voltage region and the alignment mark region to perform an oxidation process on the exposed surface of the substrate in the medium voltage region and the alignment mark region, thereby realizing the growth of the oxide portion, wherein the oxide portion extends into a certain depth of the substrate. Then, after forming a deep N-type well and a high-voltage P-type well in the substrate, the oxide portion and a part of the substrate in the alignment mark region are removed to form a deeper second trench in the alignment mark region. Then, a first trench is formed in the medium voltage region with the removal of the oxide portion in the medium voltage region, wherein the first trench is shallower than the second trench. In the method for forming alignment keys of a semiconductor structure according to an embodiment of the present invention, it is not necessary to use a traditional zero mask to form the alignment mark (i.e., the alignment key), which has the advantage of saving the cost of the mask. In addition, the alignment key formed in the alignment mark region has a larger depth than the trench in the medium voltage region, and the deep enough alignment key can provide better alignment function in the subsequent exposure process of the multilayer film to improve the wafer quality.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
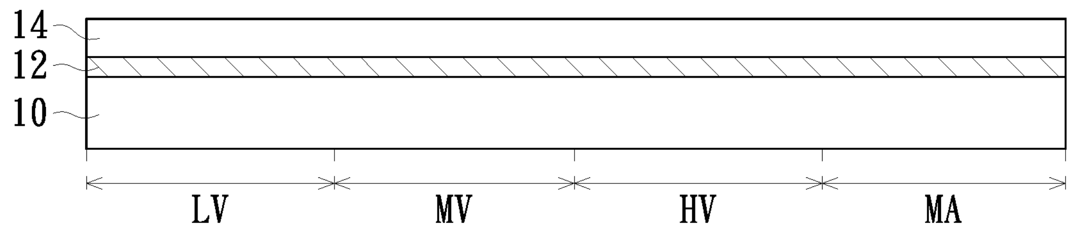
FIGS. 1A to 1J are schematic cross-sectional views of various stages of a method for forming alignment keys of a semiconductor structure according to an embodiment of the present invention.

FIGS. 1A to 1J are schematic cross-sectional views of various stages of a method for forming alignment keys of a semiconductor structure according to an embodiment of the present invention. As shown in FIG. 1A, a substrate 10 is provided. The substrate 10 is, for example, a silicon (Si) wafer. The substrate 10 is defined into a low voltage region LV, a medium voltage region MV, a high voltage region HV and an alignment mark region MA. In one embodiment, the medium voltage region MV is located between the low voltage region LV and the high voltage region HV, and the alignment mark region MA is adjacent to the high voltage region HV. Then, an oxide pad layer 12 and a passivation layer 14 are sequentially formed on the substrate 10. In one embodiment, the oxide pad layer 12 may be a silicon oxide layer, and the oxide pad layer 12 is formed on the substrate 10 by, for example, thermal oxidation or low pressure chemical vapor deposition (LPCVD). The thickness of the oxide pad layer 12 is between 80 and 140 angstroms (Å), and the preferred thickness of the oxide pad layer 12 is, for example, 110 angstroms. The passivation layer 14 may be a silicon nitride layer, and the passivation layer 14 is formed on the oxide pad layer 12 by, for example, low pressure chemical vapor deposition. The thickness of the passivation layer 14 is between 200 and 500 angstroms, and the preferred thickness of the passivation layer 14 is, for example, 220 angstroms. In addition, the material of the oxide pad layer 12 is not limited to silicon oxide, and any other suitable materials that can alleviate the stress differences in heterogeneous materials between the passivation layer 14 and the oxide pad layer 12 can be selected. The material of the passivation layer 14 is not limited to silicon nitride, and any other suitable materials (e.g., titanium nitride (TiN)) with a different etch selectivity ratio to silicon dioxide ($SiO_2$) and silicon (Si) can be selected.

Figure 1B:
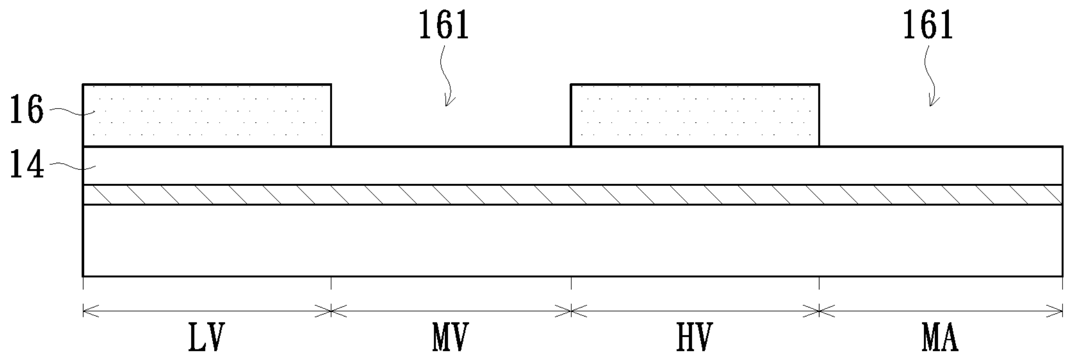

Then, as shown in FIG. 1B, a first patterned photoresist layer 16 is formed on the passivation layer 14. The first patterned photoresist layer 16 has a plurality of first patterned openings 161. In one embodiment, the first patterned opening 161 is defined by a thick gate-oxide reverse (TGR) mask which is controlled by a step height in the medium voltage region to perform a mask pattern transfer on the first patterned photoresist layer 16. In one embodiment, the first patterned openings 161 of the first patterned photoresist layer 16 correspond to the medium voltage region MV and the alignment mark region MA to expose the passivation layer 14 in the medium voltage region MV and the alignment mark region MA. The medium voltage region step height defined by the TGR mask is used to adjust the level of the wafer (substrate), so that each region has the same level when the wafer grows on the gate oxide layer. Specifically, a thicker oxide layer will be formed in the medium voltage region MV in the subsequent process, so it is necessary to form a trench (i.e., the first trench described later) in the medium voltage region MV in advance so that the gate oxide layer can be buried down and only the same height of the gate oxide layer as the logic element region (e.g., the low voltage region LV) is exposed.

Figure 1C:
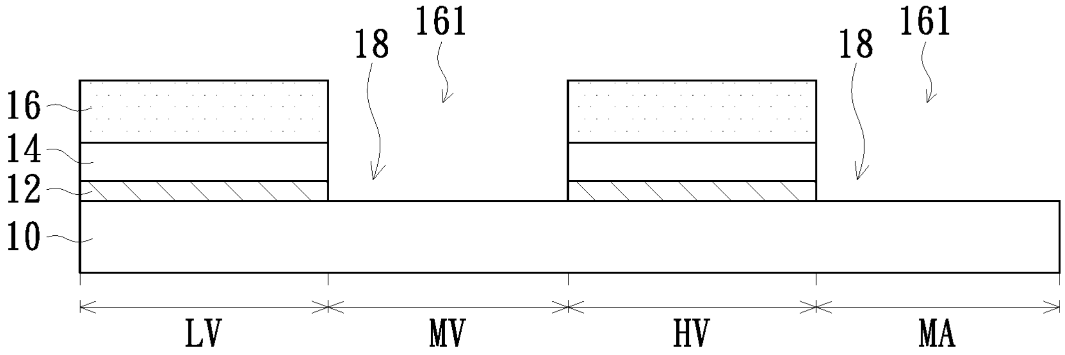
Figure 1D:
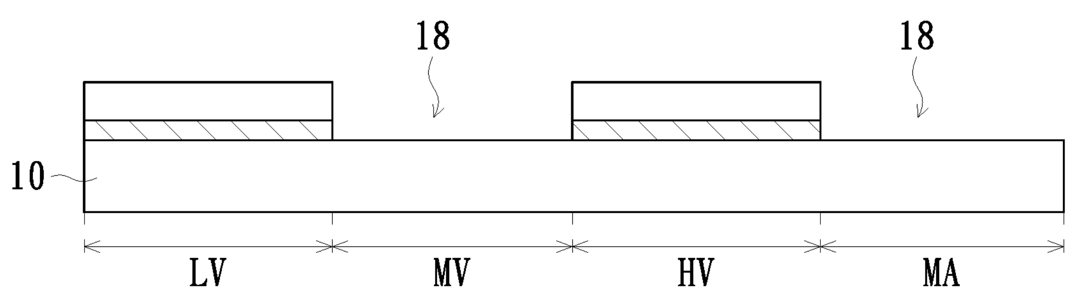

Then, as shown in FIG. 1C, the first patterned photoresist layer 16 is used as a mask to remove a part of the passivation layer 14 and a part of the oxide pad layer 12 exposed through the first patterned openings 161, so as to form a plurality of grooves 18 on the stacked oxide pad layer 12 and passivation layer 14. The grooves 18 correspond to the medium voltage region MV and the alignment mark region MA, and a part of the substrate 10 is exposed through the grooves 18. Then, as shown in FIG. 1D, the first patterned photoresist layer 16 is removed, and the surface of the substrate 10 in the medium voltage region MV and the alignment mark region MA is exposed through the grooves 18.

Figure 1E:
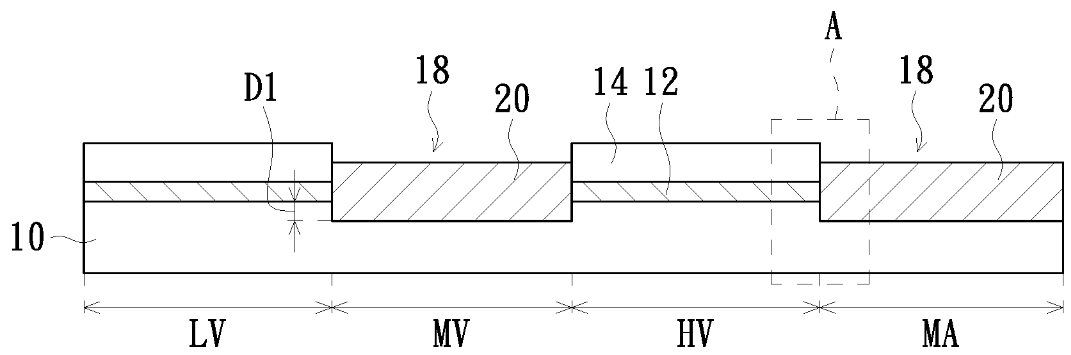
Figure 2:
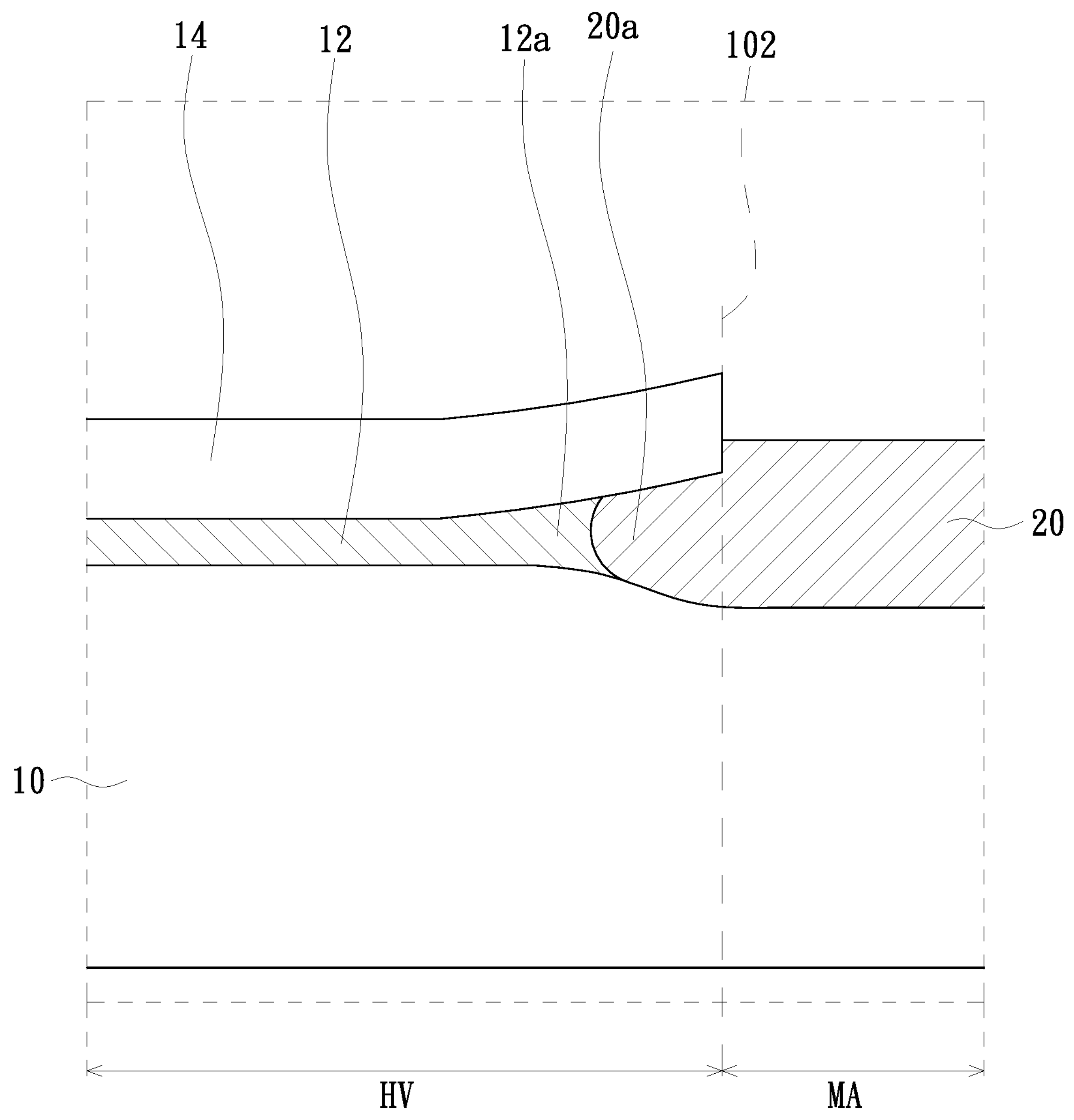
FIG. 2 is a partially enlarged schematic view of the area A in FIG. 1E.

Then, as shown in FIG. 1E, an oxidation process is performed on the exposed surface of the substrate 10 in the grooves 18 to form a plurality of oxide portions 20 on the surface of the substrate 10 exposed by the grooves 18. The oxide portions 20 correspond to the medium voltage region MV and the alignment mark region MA. Each of the oxide portions 20 is formed in the respective groove 18 and extends into the first depth D1 of the substrate 10. Specifically, the aforementioned oxidation process is a thermal oxidation process. The thermal oxidation process achieves the growth of the oxide portions 20 by oxidizing and consuming the exposed surface of the substrate 10 within a certain range of duration. The thickness of the oxide portion 20 is, for example, between 400 and 500 angstroms, and the preferred thickness of the oxide portion 20 is, for example, 425 angstroms. The thickness of the consumed substrate 10 is, for example, 200 angstroms, that is, the first depth D1 is, for example, 200 angstroms. In other embodiments, the first depth D1 may also be less than 200 angstroms. FIG. 2 is a partially enlarged schematic view of the area A in FIG. 1E, wherein the area A is defined as an area around a junction 102 of the alignment mark region MA and the high voltage region HV. In one embodiment as shown in FIG. 2, a part of the substrate 10 on the side of the oxide portion 20 is further oxidized laterally during the thermal oxidation process, so that some of the substrate 10 adjacent to the junction 102 in the high voltage region HV is also consumed to form the oxide portion 20*a*. In addition, a part of the oxide pad layer 12*a* adjacent to the junction 102 in the high voltage region HV increases in thickness and causes the passivation layer 14 to be partially lifted or raised.

Figure 1F:
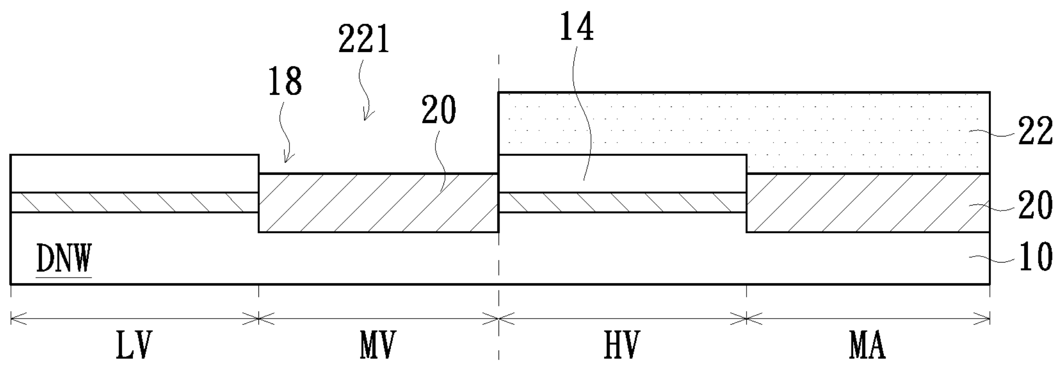

Then, as shown in FIG. 1F, a second patterned photoresist layer 22 is formed. The second patterned photoresist layer 22 has a plurality of second patterned openings 221. The second patterned openings 221 are used to define a region for the subsequent first ion implantation. The second patterned openings 221 correspond to the low voltage region LV and the medium voltage region MV, so the second patterned photoresist layer 22 covers the oxide portion 20 in the alignment mark region MA and the passivation layer 14 in the high voltage region HV and exposes the oxide portion 20 in the medium voltage region MV and the passivation layer 14 in the low voltage region LV. Then, the second patterned photoresist layer 22 is used as a mask to perform the first ion implantation on the medium voltage region MV and the low voltage region LV. In one embodiment, a deep N-type well DNW is formed in the medium voltage region MV and the low voltage region LV of the substrate 10 by the first ion implantation. Then, the second patterned photoresist layer 22 is removed.

Figure 1G:
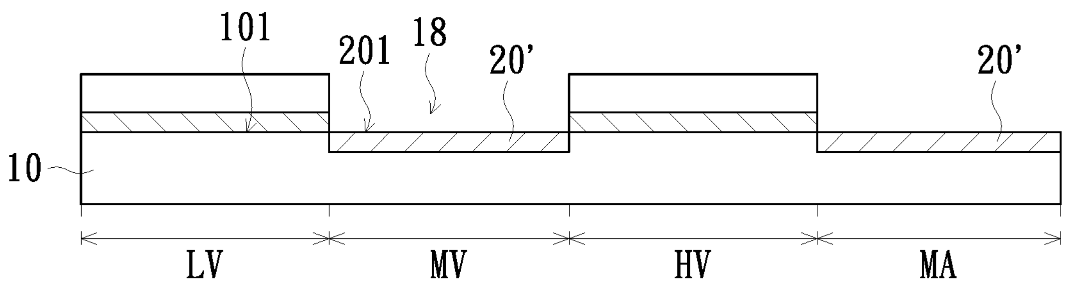

Then, a cleaning process is performed to remove a part of the oxide portion 20 in the groove 18. In one embodiment, diluted hydrofluoric acid (DHF) is used to etch and clean the oxide portion 20 in a wet etching acid tank, and the cleaning time is, for example, 600 seconds. Thus, as shown in FIG. 1G, a thinned oxide portion 20' is obtained. In one embodiment, the surface 201 of the thinned oxide portion 20' is, for example, equal to or slightly higher than the surface 101 of the substrate 10.

Figure 1H:
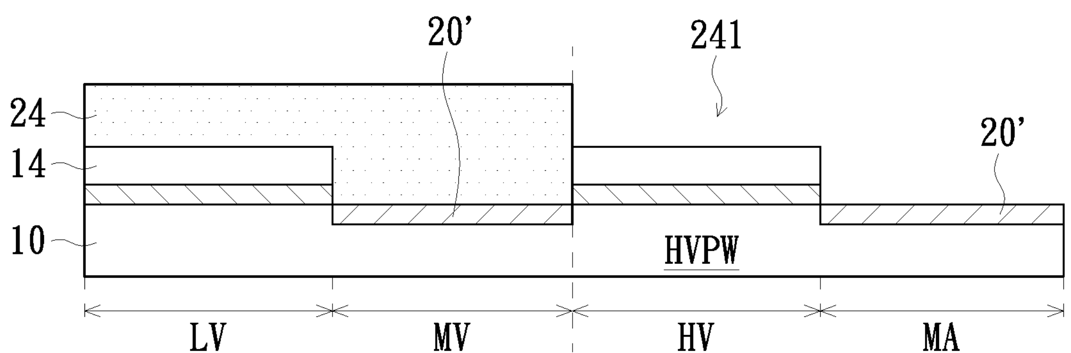

Then, as shown in FIG. 1H, a third patterned photoresist layer 24 is formed. The third patterned photoresist layer 24 has a plurality of third patterned openings 241. The third patterned openings 241 are used to define a region for the subsequent second ion implantation. The third patterned openings 241 correspond to the high voltage region HV and the medium voltage region MV, so the third patterned photoresist layer 24 covers the thinned oxide portion 20' in the medium voltage region MV and the passivation layer 14 in the low voltage region LV and exposes the thinned oxide portion 20' in the alignment mark region MA and the passivation layer 14 in the high voltage region HV. Then, the third patterned photoresist layer 24 is used as a mask to perform the second ion implantation on the high voltage region HV and the alignment mark region MA. In one embodiment, a high-voltage P-type well HVPW is formed in the high voltage region HV and the alignment mark region MA of the substrate 10 by the second ion implantation.

Figure 1I:
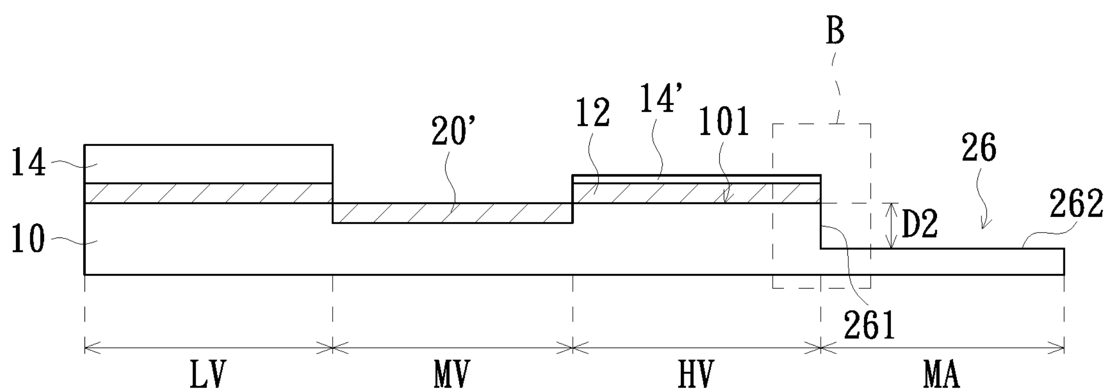

Then, the third patterned photoresist layer 24 is used as a mask to perform an etching process on the high voltage region HV and the alignment mark region MA to remove the thinned oxide portion 20' and a part of the substrate 10 under the thinned oxide portion 20' in the alignment mark region MA and a part of the passivation layer 14 on the oxide pad layer 12 in the high voltage region HV. In one embodiment as shown in FIG. 1I, a part of the passivation layer 14' is remained on the oxide pad layer 12 in the high voltage region HV; however, the passivation layer 14' may be completely removed in another embodiment not shown. Then, the third patterned photoresist layer 24 (shown in FIG. 1H) is removed. A second trench 26 having a second depth D2 is formed in the alignment mark region MA by removing a part of the substrate 10 in the alignment mark region MA. The second trench 26 has a sidewall 261 and a bottom 262, and the second depth D2 is the distance from the surface 101 of the substrate 10 to the bottom 262 of the second trench 26. The second depth D2 of the second trench 26 is greater than 280 angstroms. In one embodiment, the second depth D2 is, for example, between 480 and 500 angstroms. The second trench 26 can be used as an alignment key for subsequent exposure processes of other film layers.

Figure 3:
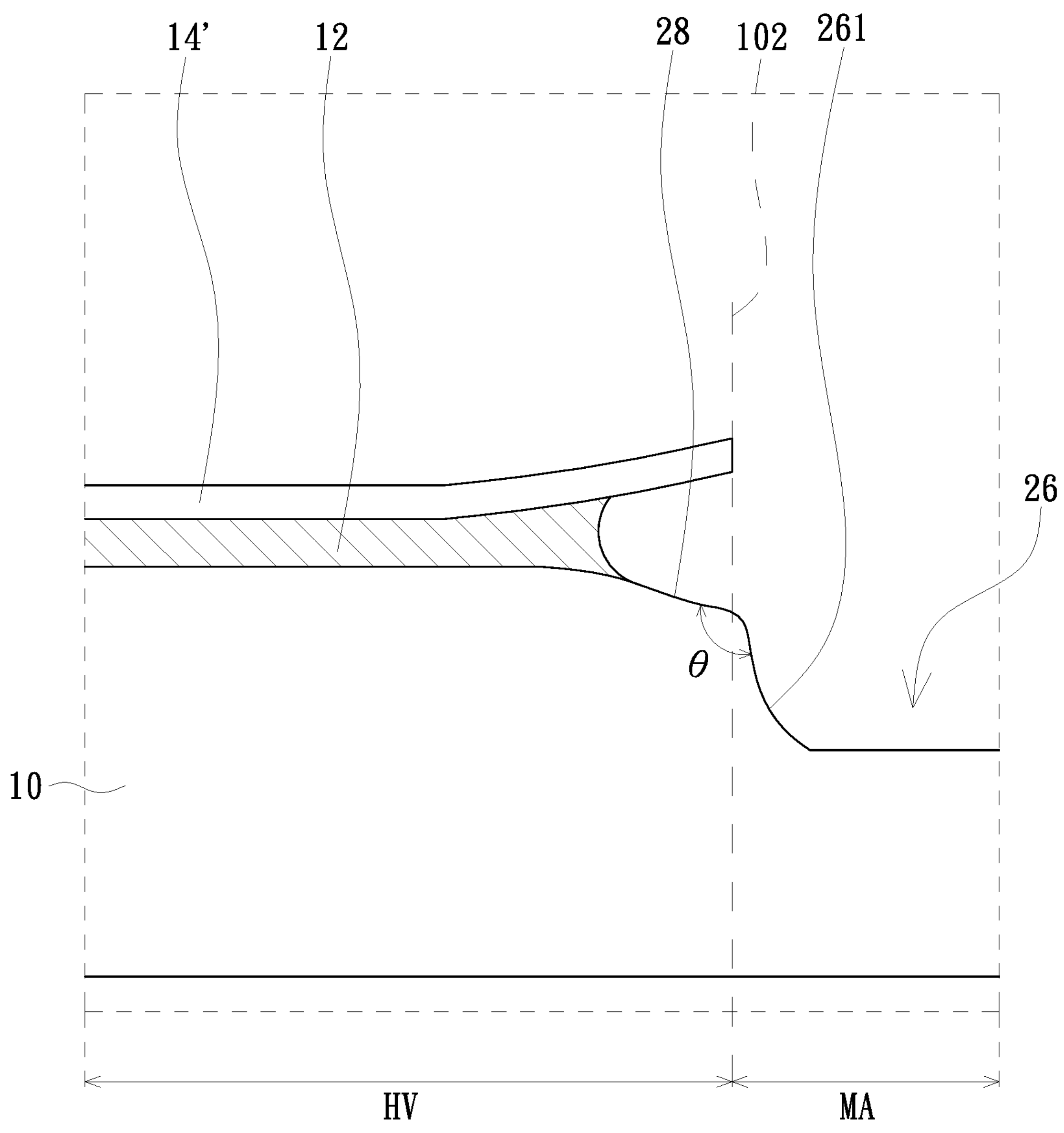
FIG. 3 is a partially enlarged schematic view of the area B in FIG. 1I.

Continue the above description. FIG. 3 is a partially enlarged schematic view of the area B in FIG. 1I, wherein the area B is defined as an area around the junction 102 of the alignment mark region MA and the high voltage region HV in one embodiment. The oxide portion 20*a* (shown in FIG. 2) adjacent to the junction 102 in the high voltage region HV is also removed when removing the thinned oxide portion 20' (shown in FIG. 1H) and a part of the substrate 10 under the thinned oxide portion 20' in the alignment mark region MA. Thus, as shown in FIG. 3, in addition to forming a deeper second trench 26 in the alignment mark region MA, the substrate 10 is also formed with a recessed surface 28 adjacent to the junction 102 in the high voltage region HV. The recessed surface 28 is connected to the sidewall 261 of the second trench 26. There is an angle θ between the recessed surface 28 and the sidewall 261. The angle θ is, for example, an obtuse angle and ranges from 90 to 135 degrees. As shown in FIG. 3, the passivation layer 14' remaining on the oxide pad layer 12 in the high voltage region HV is still partially lifted.

Figure 1J:
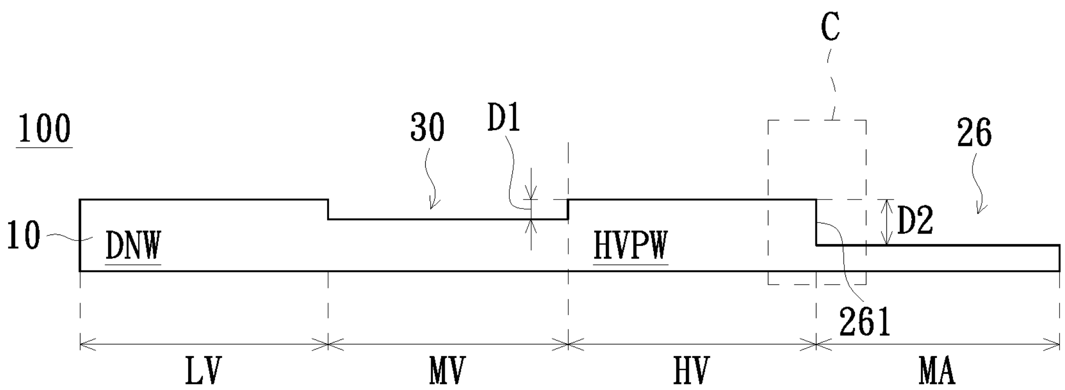

Then, as shown in FIG. 1I, the passivation layers 14, 14', the oxide pad layer 12 and the thinned oxide portion 20' are removed to obtain the semiconductor structure 100 having alignment keys (shown in FIG. 1J). Specifically, the passivation layer 14 in the low voltage region LV and the remained passivation layer 14' in the high voltage region HV are first removed, wherein the passivation layers 14, 14' are removed with, for example, a phosphoric acid solution. Then, the oxide pad layer 12 in the low voltage region LV and the high voltage region HV and the thinned oxide portion 20' in the medium voltage region MV are removed. In one embodiment, the oxide pad layer 12 and the thinned oxide portion 20' are etched and cleaned with diluted hydrofluoric acid. Then, as shown in FIG. 1J, the first trench 30 having a first depth D1 is formed in the medium voltage region MV of the substrate 10 with the removal of the thinned oxide portion 20'. The first depth of D1 of the first trench 30 is less than the second depth D2 of the second trench 26, and the first depth D1 is, for example, 200 angstroms or less than 200 angstroms.

FIG. 1J is a schematic view of a semiconductor structure having alignment keys according to an embodiment of the present invention. As shown in FIG. 1J, the semiconductor structure 100 having alignment keys includes a substrate 10, a deep doped well and a high-voltage doped well. The doping type of the deep doped well is different from the doping type of the high-voltage doped well. A low voltage region LV, a medium voltage region MV, a high voltage region HV and an alignment mark region MA are defined on the substrate 10, and the high voltage region HV is adjacent to the alignment mark region MA. The medium voltage region MV of the substrate 10A is formed with a first trench 30. The first trench 30 has a first depth D1, and the first depth D1 is, for example, 200 angstroms or less than 200 angstroms. The alignment mark region MA of the substrate 10 is formed with a second trench 26 extending to the junction of the alignment mark region MA and the high voltage region HV. The second trench 26 has a second depth D2, and the second depth D2 is greater than the first depth D1. In one embodiment, the second depth D2 is greater than 280 angstroms. A deep doped well, such as the deep N-type well DNW, is formed in the medium voltage region MV and the low voltage region LV. A high-voltage doped well, such as the high-voltage P-type well HVPW, is formed in the high voltage region HV and the alignment mark region MA.

Figure 4:
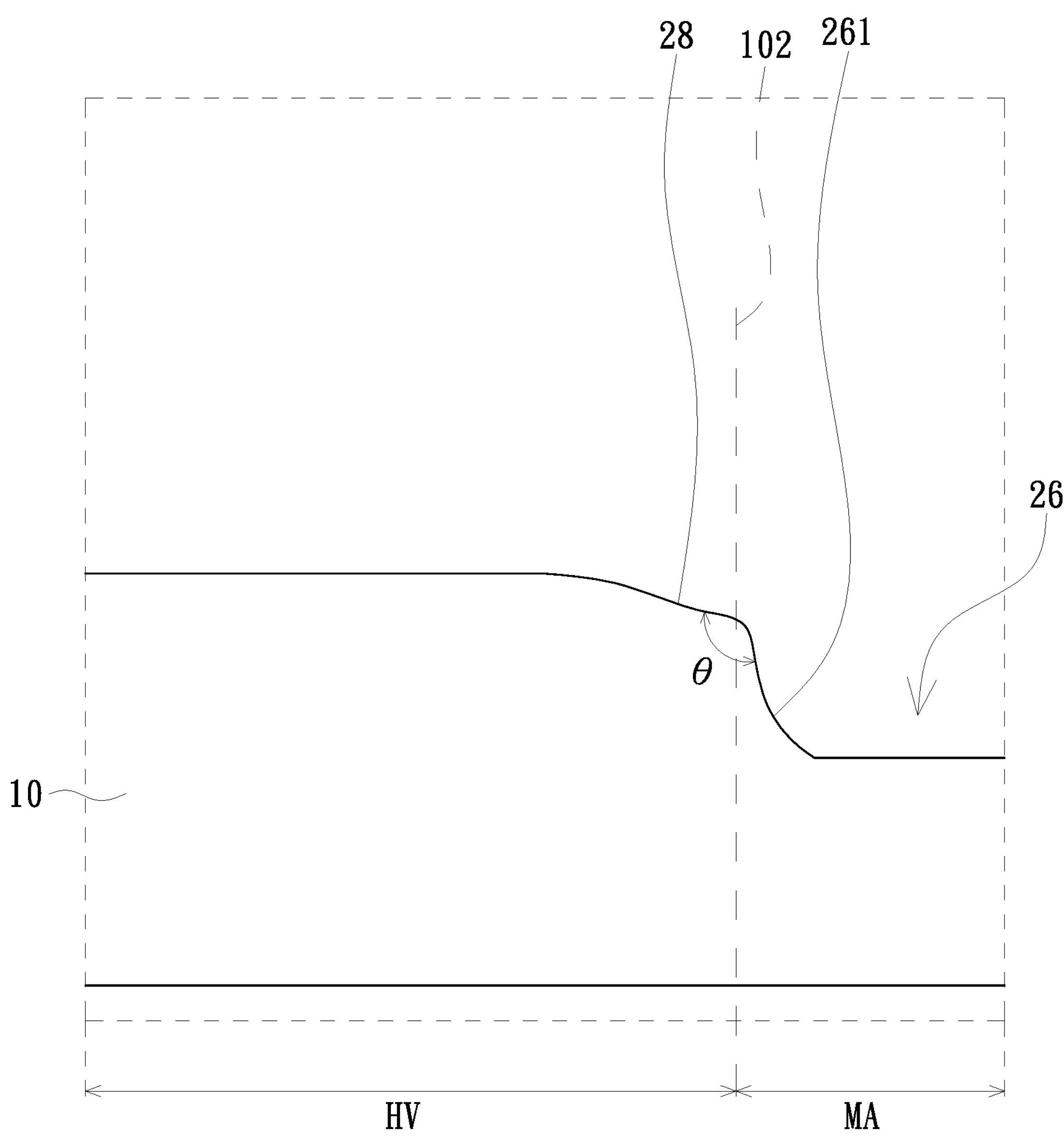
FIG. 4 is a partially enlarged schematic view of the area C in FIG. 1J.

Continue the above description. FIG. 4 is a partially enlarged schematic view of the area C in FIG. 1J, wherein the area C is defined as an area around the junction 102 of the alignment mark region MA and the high voltage region HV. As shown in FIG. 4, the substrate 10 in the high voltage region HV adjacent to the junction 102 is formed with a recessed surface 28. The recessed surface 28 is connected to the sidewall 261 of the second trench 26. There is an angle θ between the recessed surface 28 and the sidewall 261. The angle θ is, for example, an obtuse angle. In one embodiment, the recessed surface 28 has a first slope, the sidewall 261 has a second slope, and the first slope is smaller than the second slope. That is, the inclination of the recessed surface 28 is lower than the inclination of the sidewall 261.

Figure 5:
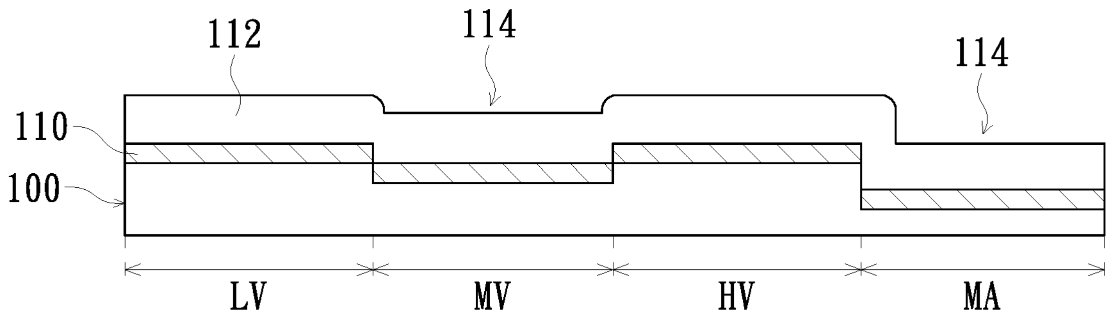
FIG. 5 is a schematic view of an application of a semiconductor structure having alignment keys according to an embodiment of the present invention.

FIG. 5 is a schematic view of an application of a semiconductor structure having alignment keys according to an embodiment of the present invention. As shown in FIG. 5, when the semiconductor structure 100 having alignment keys is applied to a subsequent process, an oxide pad layer 110 and a silicon nitride layer 112 are sequentially formed on the semiconductor structure 100 having alignment keys. The silicon nitride layer 112 has a trench outline 114 in the medium voltage region MV and the alignment mark MA region.

According to the above, in the method for forming alignment keys of a semiconductor structure according to an embodiment of the present invention, the first patterned photoresist layer defined by the TGR mask which is controlled by a step height in the medium voltage region is used as the first photoresist for forming the alignment keys. In addition to defining the pattern in the medium voltage region, the first patterned photoresist layer also defines the pattern in the alignment mark region. The first patterned photoresist layer forms a groove for exposing the medium voltage region and the alignment mark region to perform an oxidation process on the exposed surface of the substrate in the medium voltage region and the alignment mark region. The exposed surface of the substrate is consumed to realize the growth of the oxide portion, so that the oxide portion extends into a certain depth of the substrate. Then, an ion implantation is performed to form a deep N-type well and a high-voltage P-type well in the substrate, the oxide portion and a part of the substrate in the alignment mark region are removed to form a deeper second trench in the alignment mark region. Then, a first trench is formed in the medium voltage region with the removal of the oxide portion in the medium voltage region, wherein the first trench is shallower than the second trench.

In the method for forming alignment keys of a semiconductor structure according to an embodiment of the present invention, it is not necessary to use a traditional zero mask to form the alignment mark (i.e., the alignment key), which has the advantage of saving the cost of the mask. In addition, the alignment key formed in the alignment mark region has a larger depth than the trench in the medium voltage region, and the deep enough alignment key can provide better alignment function in the subsequent exposure process of the multilayer film to improve the wafer quality.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor structure having alignment keys, comprising:

a substrate, wherein at least one low voltage region, at least one medium voltage region, at least one high voltage region and at least one alignment mark region are defined on the substrate, and the at least one high voltage region is adjacent to the at least one alignment mark region;

a first trench, formed in the at least one medium voltage region of the substrate;

a second trench, formed in the at least one alignment mark region of the substrate and extending to a junction of the at least one alignment mark region and the at least one high voltage region, wherein the second trench has a sidewall, the first trench has a first depth, the second trench has a second depth, and the second depth is greater than the first depth;

a recessed surface, formed in the at least one high voltage region of the substrate adjacent to the junction, wherein the recessed surface is connected to the sidewall, and an angle is formed between the recessed surface and the sidewall;

at least one deep doped well, formed in the at least one medium voltage region and the at least one low voltage region; and at least one high-voltage doped well, formed in the at least one high voltage region and the at least one alignment mark region, wherein a doping type of the deep doped well is different from a doping type of the high voltage doped well.

2. The semiconductor structure having alignment keys according to claim 1, wherein the recessed surface has a first slope, the sidewall has a second slope, and the first slope is smaller than the second slope.

3. The semiconductor structure having alignment keys according to claim 1, wherein the deep doped well is a deep N-type well, and the high-voltage doped well is a high-voltage P-type well.

4. The semiconductor structure having alignment keys according to claim 1, wherein the second depth is between 280 angstroms and 500 angstroms.

5. The semiconductor structure having alignment keys according to claim 1, wherein the first depth is 200 angstroms.

* * * * *